United States Patent [19]

Ellis et al.

[11] Patent Number: 4,656,421
[45] Date of Patent: Apr. 7, 1987

[54] MAGNETIC FIELD SENSORS

[75] Inventors: Stafford M. Ellis, West Sussex; Donald R. C. Price, Maidstone, both of England

[73] Assignee: GEC Avionics Limited, England

[21] Appl. No.: 777,175

[22] Filed: Sep. 18, 1985

[30] Foreign Application Priority Data

Sep. 24, 1984 [GB] United Kingdom ............... 8424132

[51] Int. Cl.$^4$ ..................... G01R 33/032; G01B 9/02
[52] U.S. Cl. .................................. 324/244; 350/371; 356/345; 250/231 R
[58] Field of Search ............... 324/244, 260, 261, 200, 324/96, 262, 249; 350/371, 358, 353, 374–378; 356/345; 250/227, 231 R; 335/3, 215; 332/7.51

[56] References Cited

U.S. PATENT DOCUMENTS 4,368,430  1/1983  Dale et al. ........................... 324/244
4,433,291  2/1984  Yariv et al. ......................... 324/244
4,587,487  5/1986  Zanzucchi .......................... 324/244

OTHER PUBLICATIONS

Optical Fiber Sensor Technology, IEEE Journal of Quantum Electronics, vol. QE-18, No. 4, Apr. 1982, pp. 626–665.
An Introduction to the Theory and Use of Thermostatic Bimetals Engineering, pp. 1–12, published Sep. 1961.

*Primary Examiner*—Reinhard J. Eisenzopf
*Assistant Examiner*—Warren S. Edmonds
*Attorney, Agent, or Firm*—Kirschstein, Kirschstein, Ottinger & Israel

[57] ABSTRACT

A magnetic field sensor in the form of an arcuate element comprising two superimposed strips of material is described. The magnetostrictive constant along the longitudinal axis of one of the strips is greater than that of the other strip, the latter strip carrying at each end a post. In use of the sensor a single mode optical fibre is attached to the element via the posts such that the part of the fibre between the posts extends along a chord of the arc defined by the element. A variation in applied magnetic field in the plane containing the arc gives rise to a variation in the part of the fibre between the posts. Light passing through the fibre is thus phase shifted by an amount dependent on the value of the applied magnetic field.

5 Claims, 3 Drawing Figures

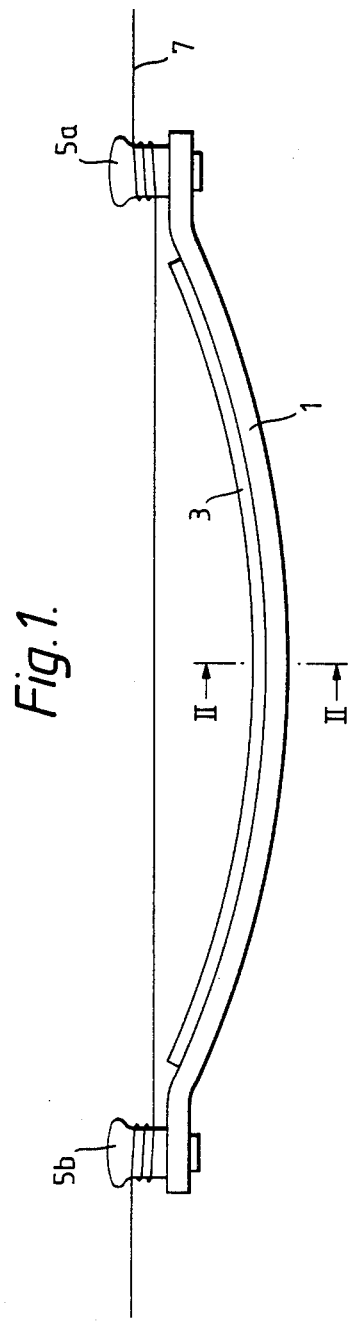
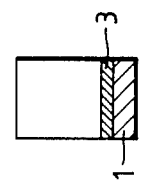

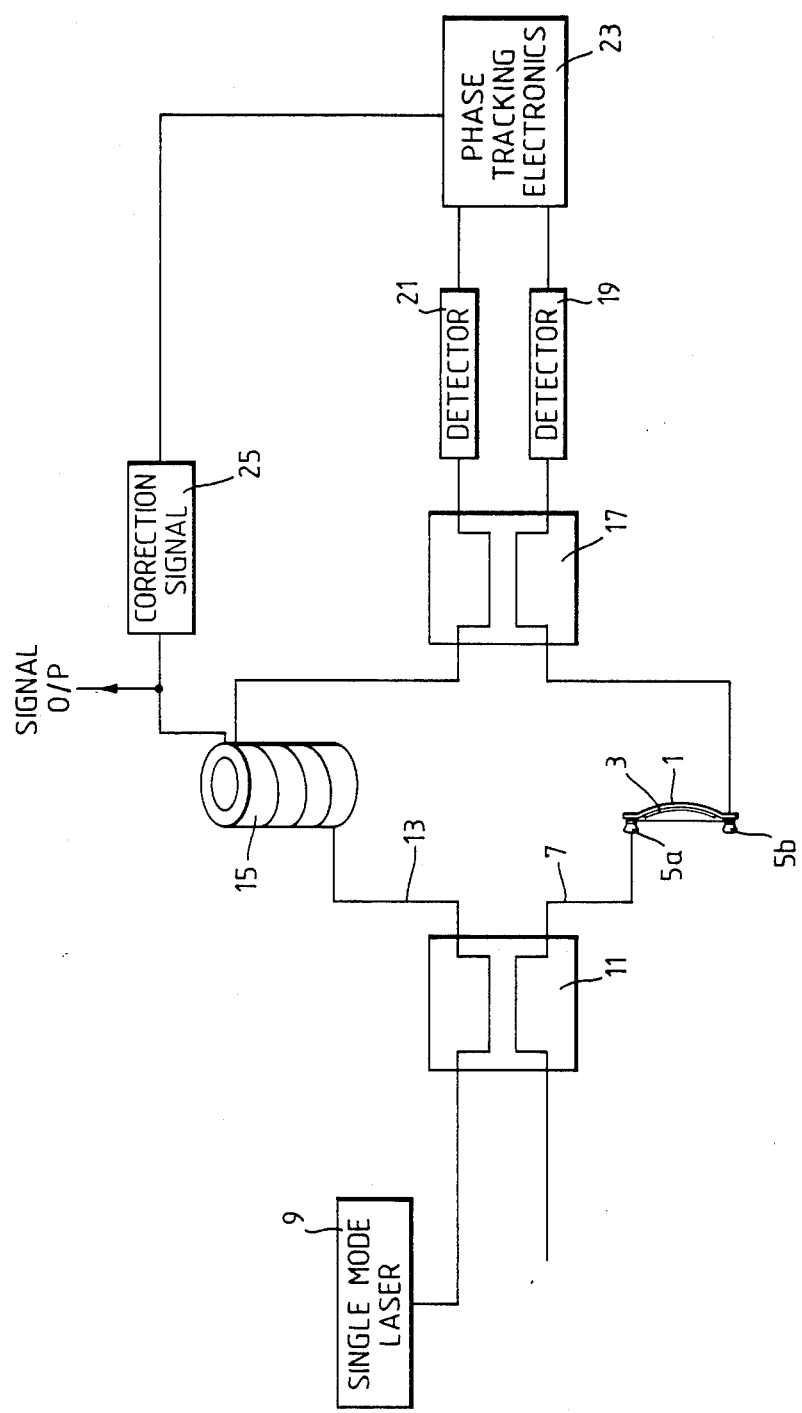

MAGNETIC FIELD SENSORS

This invention relates to magnetic field sensors.

In recent years a number of so called optical fibre magnetic field sensors have been developed. Examples of three such sensors are shown in the review article "Optical Fiber Sensor Technology", published on pages 626–665 of the IEEE Journal of Quantum Electronics, Vol. QE-18 No. 4, April 1982. Each sensor comprises a magnetostrictive element, a single mode optical fibre being bonded along its length to the element. Any change in magnetic field will produce a variation in the size of the magnetostrictive element, which as a result of its bonding to the optical fibre will produce a strain in the fibre. This strain gives rise to an optical phase change, which may be measured, for example in an interferometer of which the fibre forms a part. In the first particular sensor described in the article, the magnetostrictive element is in the form of a mandrel, round which the fibre is wound, in the second sensor the element is a coating on the fibre, whilst in the third sensor the element is an elongate strip along which the fibre runs.

In the coating and elongate strip arrangements, the sensitivity of the sensor is determined by the length of the coating or strip to which the fibre is attached, this producing a limit on the minimum length of the device.

Whilst in the mandrel arrangement, this problem is overcome, the form of the magnetostrictive element means that it has no directional sensitivity within its plane of sensitivity.

Furthermore in each of these arrangements it is necessary to attach the fibre along its length to the magnetostrictive element.

It is an object of the present invention to provide an alternative form of optical fibre magnetic field sensor wherein these difficulties may be alleviated.

According to the present invention a magnetic field sensor comprises an arcuate element comprising two superimposed elongate strips of material, the magnetostrictive constant along the longitudinal axis of one of the strips being greater than that of the other strip; and means for attaching an optical fibre along a chord of the element such that a variation in applied magnetic field in the plane containing the arc of the element gives rise to a variation in the curvature of the element so as to produce a variation in the strain in the fibre.

The means for attaching suitably comprises a pair of posts, one at each end of the chord. These posts preferably project from said other strip.

The fibre is suitably part of a Mach-Zehnder interferometer arranged to monitor changes in optical phase of light passing through the fibre.

The material of said one strip is suitably a metallic glass.

One particular magnetic field sensor in accordance with the invention, together with an interferometer incorporating the sensor, will now be described, by way of example only, with reference to the accompanying drawings in which:

FIG. 1 is a schematic side view of the sensor;
FIG. 2 is a section along the line II—II of FIG. 1; and
FIG. 3 is a schematic diagram of an interferometer incorporating the sensor.

Referring firstly to FIGS. 1 and 2 the sensor comprises an arcuate metallic element, comprising a strip of metal of low magnetostrictive constant 1 to which is bonded a strip of a metallic glass 3, for example FeBSi. The ends of the strip 1 extend beyond the strip 3, a respective post 5a or 5b being provided at each end. A single mode optical fibre 7 is secured to the bimetallic element, by being wound round and glued to each post, such that the portion of the fibre between the posts 5a, 5b is taut so as to form a chord of the arc defined by the bimetallic element.

Referring now also to FIG. 3, the sensor is incorporated in a Mach-Zehnder interferometer. This comprises a single mode laser 9 which produces a beam which is split by a beam splitter arrangement 11 between the fibre 7 and a reference fibre 13. Part of the reference fibre 13 is wound round and glued to a piezoelectric cylinder 15. The beams passing through the fibres 7,13 are combined in a combiner 17 to produce two complementary beams which are detected by respective detectors 19,21 whose outputs are connected to a phase tracking electronics arrangement 23 which is in turn connected to an arrangement 25 for providing a voltage across the piezoelectric cylinder 15.

In use of the interferometer to monitor changes in a DC magnetic field applied in the plane containing the arc defined by the bimetallic element, an AC bias magnetic field is applied in this plane. The resultant varying magnetic field will cause changes in the length of the strip 3 relative to that of the strip 1. This will cause changes in curvature of the element, consequential changes in the strain in the part of the fibre 7 between the posts 5a, 5b being produced. The phase of the light passing through the fibre 7 will therefore change relative to the phase of the light passing through the fibre 13, this phase change being detected by the detectors 19, 21. By using the phase tracking electronics arrangement 23 and arrangement 25 to apply a feedback voltage to the piezoelectric cylinder 15, the phase change produced by the strain produced in the reference fibre 13 by its attachment to the piezoelectric cylinder may be used to cause the two outputs of the detectors 19, 21 to be maintained at their quadrature points i.e. to phase lock the system. This "active homodyne" detection system enables amplitude fluctuations in the light from the laser common to both arms of the interferometer to cancel out.

Any subsequent changes in the DC field being monitored produces a corresponding change in the output signal produced by the interferometer which is thus indicative of the strength of the DC magnetic field.

For a semi-circular arc, the sensitivity to the field of the sensor is approximately uniform in the plane of the arc, falling off cosinusoidally out of the plane. If however the bimetallic element is bow shaped, a directional sensitivity within the plane of the arc is achieved.

The design of the actual sensor, apart from considerations of mechanical strength, generally focusses on two principal criteria. One is the 'mechanical' gain K defined as the relative unloaded extension of the chord defined by the part of the optical fibre 7 between the posts divided by difference between the relative extensions of the components of the bimetallic element.

Bimetallic strip theory as for example given in "Engineering" published September, 1961 pages 1 to 12 indicates that in the case of a semi-circular bimetallic strip this ratio K is approximately given by $$K = (3R/2t)$$

where R is the radius of the semi-circle and t is the thickness of the strips Where R is 25 mm, and t is 1 mm, a value of K of 37.5 is achieved. Thus a more sensitive device may be obtained than with known optical fibre magnetic field sensors.

The second design criterion is a preference to drive the sensor at a high frequency typically in the region of 1 KHz by choice of an appropriate AC magnetic bias field, so as to reduce the sensor's susceptibility to vibration. The ability to construct the sensor with adequate sensitivity using a short length of optical fibre enables its mechanical reasonant frequency to be substantially raised.

If an addition the mechanical resonant frequency and the frequency of the applied magnetic field are similar the sensitivity of the sensor is found to be enhanced. As fibres are normally protected by a thin mechanically lossy coating which reduces the mechanical coupling between the fibre and the arcuate element and thus the maximum possible sensitivity, this has particular advantage.

It will be appreciated that whilst in the sensor and interferometer described herebefore by way of example the sensor is arranged to monitor changes in a DC magnetic field in the presence of an AC bias field so as to achieve optimum sensitivity generally a sensor in accordance with the invention will be responsive to any change in applied magnetic field.

It will also be appreciated that in some applications a gradiometer employing two parallel triads of three orthogonal sensors in accordance with the invention may be useful. Each pair of sensors within a pair of parallel planes would be separated by a known displacement, the magnetic field gradient in a direction normal to the planes being obtained from the difference in outputs obtained from each of the pair.

We claim:

1. A magnetic field sensor comprising an arcuate element comprising two superimposed elongate strips of material, the magnetostrictive constant along the longitudinal axis of one of the strips being greater than that of the other strip; and means for attaching an optical fibre along a chord of the element such that a variation in applied magnetic field in the plane containing the arc of the element gives rise to a variation in the curvature of the element so as to produce a variation in the strain in the fibre wherein the variation in the curvature of the element is indicative of the applied magnetic field.

2. A sensor according to claim 1 in which the means for attaching comprises a pair of posts, one at each end of the chord.

3. A sensor according to claim 2 in which the posts project from said other strip.

4. A sensor according to claim 1 in which the material of said one strip is a metallic glass.

5. A sensor according to claim 1 in which the fibre forms part of a Mach-Zehnder the interferometer arranged to monitor changes in optical phase of light passing through the fibre.

* * * * *